US011977118B2

(12) United States Patent
Haines et al.

(10) Patent No.: US 11,977,118 B2
(45) Date of Patent: May 7, 2024

(54) TESTER FOR A FREQUENCY-DEPENDENT GROUND FAULT INTERRUPT WIRING DEVICE

(71) Applicant: Pass & Seymour, Inc., Syracuse, NY (US)

(72) Inventors: Joshua P. Haines, Marcellus, NY (US); Michael F. McMahon, North Syracuse, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 364 days.

(21) Appl. No.: 17/188,037

(22) Filed: Mar. 1, 2021

(65) Prior Publication Data

US 2021/0270901 A1  Sep. 2, 2021

Related U.S. Application Data

(60) Provisional application No. 62/982,394, filed on Feb. 27, 2020.

(51) Int. Cl.
*G01R 31/327* (2006.01)
*H02H 3/05* (2006.01)
*H02H 3/16* (2006.01)

(52) U.S. Cl.
CPC ........... *G01R 31/3277* (2013.01); *H02H 3/05* (2013.01); *H02H 3/16* (2013.01)

(58) Field of Classification Search
CPC ............ H02H 3/16; H02H 3/334; H02J 3/007
See application file for complete search history.

(56) References Cited

U.S. PATENT DOCUMENTS

| | | | | |
|---|---|---|---|---|
| 4,217,645 A | * | 8/1980 | Barry | G01R 31/379 324/426 |
| 6,128,169 A | * | 10/2000 | Neiger | H02H 3/334 324/520 |
| 2007/0177325 A1 | * | 8/2007 | Zandonella Balco | H02H 3/335 361/118 |
| 2009/0180222 A1 | * | 7/2009 | Chen | H02H 9/042 361/45 |
| 2011/0216452 A1 | * | 9/2011 | Haines | H02H 3/16 361/42 |
| 2012/0281444 A1 | * | 11/2012 | Dent | H02M 7/53871 363/131 |
| 2020/0161849 A1 | | 5/2020 | Batko et al. | |

* cited by examiner

*Primary Examiner* — Jermele M Hollington
*Assistant Examiner* — Temilade S Rhodes-Vivour
(74) *Attorney, Agent, or Firm* — Bond, Schoeneck & King, PLLC; Jonathan L. Gray (57) ABSTRACT

A tester for a frequency-dependent ground fault interrupt wiring device, including: a tester circuit, including: a switch disposed between a first terminal and a second terminal, wherein a leakage current flows through a leakage path between the first terminal and the second terminal when a voltage is applied across the first terminal and the second terminal, a magnitude of the leakage current being determined, at least in part, by a conductivity of the switch; and a waveform generator configured to generate a periodic output signal having a frequency, wherein the switch is driven to modulate the magnitude of the leakage current such that the leakage current has a frequency substantially equal to a frequency of the waveform generator.

29 Claims, 3 Drawing Sheets

FIG. 3

TESTER FOR A FREQUENCY-DEPENDENT GROUND FAULT INTERRUPT WIRING DEVICE

CROSS REFERENCE TO RELATED APPLICATIONS

The present application claims priority to and the benefit of U.S. Provisional Patent Application No. 62/982,394, filed on Feb. 27, 2020, which is hereby incorporated by reference herein in its respective entirety.

FIELD OF INVENTION

This application generally relates to testing devices for ground fault interrupt wiring devices, and, more specifically, to testing devices for frequency-dependent ground fault interrupt wiring devices.

BACKGROUND

Modern appliances employ switch mode power supplies that often leak high-frequency current to earth ground. Ground fault circuit interrupt (GFCI) wiring devices, which are designed to protect users from electrical shock due to current leakage, can interpret this high-frequency current leakage as a dangerous current leakage and trip, preventing the flow of power from the wiring device receptacle. But high-frequency current, as demonstrated by the Dalziel curve, is not as dangerous as low-frequency current leakage, and thus the trip of the GFCI wiring device in response to the high-frequency current leaked by switch mode power supplies is not always dangerous. This means that the trip can often be categorized as a nuisance trip—i.e., an unnecessary trip that only serves as a nuisance to the user, who must now reset the GFCI wiring device to continue using the appliance that caused the trip.

Typically, to create a fault at the fundamental frequency of 60 Hz, a passive impedance (e.g., a resistor/inductor/capacitor network) is placed to create a path from load hot to line neutral or earth ground. In this case, the fault current takes the form of the fundamental but does not contain any other frequency content. Accordingly, there is a need in the art for an active circuit that is designed to allow leakage current other than the fundamental 60 Hz.

SUMMARY

The examples described in this disclosure can be combined in any technically possible way.

According to an aspect, tester for a frequency-dependent ground fault interrupt wiring device, includes a tester circuit, comprising: a switch disposed between a first terminal and a second terminal, wherein a leakage current flows through a leakage path between the first terminal and the second terminal when a voltage is applied across the first terminal and the second terminal, a magnitude of the leakage current being determined, at least in part, by a conductivity of the switch; a waveform generator configured to generate a waveform generator output signal; and a comparator configured to generate a comparator output signal based on a comparison of the waveform generator output signal to a current sense signal, the current sense signal being representative of the leakage current, wherein the conductivity of the switch is adjusted according to the comparator output signal such that the leakage current follows the waveform generator output signal.

In an example, the waveform generator output signal is a periodic waveform having a frequency, wherein the frequency waveform generator output signal is greater than a frequency of the voltage applied across the first terminal and the second terminal.

In an example, the voltage applied across the first terminal and the second terminal is a mains voltage.

In an example, the tester further includes a second switch disposed between the first terminal and the second terminal, wherein during a negative half cycle of the voltage applied across the first terminal and the second terminal, a second leakage current flows through a second leakage path, the magnitude of the second leakage current being determined, at least in part, by the conductivity of the second switch, wherein the leakage current flows through the leakage path during a positive half cycle of the voltage applied across the first terminal and the second terminal.

In an example, the tester further includes a second comparator configured to a second comparator output signal based on a comparison of an inverted periodic output signal, the inverted periodic output signal being an inverse of the periodic output signal, to a second current signal, the second current sense signal being representative of the second leakage current, wherein the conductivity of the second switch is adjusted according to the second comparator output signal such that the frequency of the second leakage current is substantially equal to a frequency of the waveform generator.

In an example, the waveform generator comprises a voltage-controlled oscillator.

In an example, the waveform generator output signal is a periodic waveform having a frequency, wherein the waveform generator is configured to vary the frequency of the periodic output signal.

In an example, the waveform generator is configured to vary a magnitude of the waveform generator output signal.

In an example, the waveform generator output signal is a non-sinusoidal output signal.

In an example, the waveform generator output is aperiodic.

In an example, the voltage applied across the first and second terminal is a full-wave rectified mains voltage.

In an example, the first terminal is in electrical communication with a load hot terminal of the frequency-dependent ground fault interrupt wiring device, wherein the second terminal is in electrical communication with an earth ground terminal of the frequency-dependent ground fault interrupt wiring device.

In an example, the tester circuit is disposed within a housing, wherein the housing the includes a plurality of plug blades dimensioned and arranged to engage with a receptacle of the frequency-dependent ground fault interrupt wiring device, wherein the first terminal is in electrical communication with the load hot terminal via a plug blade of the plurality of plug blades engaged with a load hot receptacle of the frequency-dependent ground fault interrupt wiring device, wherein the second terminal is in electrical communication with the earth ground terminal via a plug blade of the plurality of plug blades engaged with an earth ground receptacle of the frequency-dependent ground fault interrupt wiring device.

In an example, the first terminal is in electrical communication with a load hot terminal of the frequency-dependent ground fault interrupt wiring device, wherein the second terminal is in electrical communication with a line neutral terminal of the frequency-dependent ground fault interrupt wiring device.

In an example, the first terminal is in electrical communication with a line hot terminal of the frequency-dependent ground fault interrupt wiring device, wherein the second terminal is in electrical communication with a load neutral terminal of the frequency-dependent ground fault interrupt wiring device.

According to another aspect, a tester for a frequency-dependent ground fault interrupt wiring device, includes: a tester circuit, comprising: a switch disposed between a first terminal and a second terminal, wherein a leakage current flows through a leakage path between the first terminal and the second terminal when a voltage is applied across the first terminal and the second terminal, a magnitude of the leakage current being determined, at least in part, by a conductivity of the switch; and a waveform generator configured to generate a waveform generator output signal, wherein the switch is driven to modulate the magnitude of the leakage current such that the leakage current follows the waveform generator output signal.

In an example, the waveform generator output signal is a periodic waveform having a frequency, wherein the frequency waveform generator output signal is greater than a frequency of the voltage applied across the first terminal and the second terminal.

In an example, the voltage applied across the first terminal and the second terminal is a mains voltage.

In an example, the tester further includes a second switch disposed between the first terminal and the second terminal, wherein during a negative half cycle of the voltage applied across the first terminal and the second terminal, a second leakage current flows through a second leakage path, the magnitude of the second leakage current being determined, at least in part, by the conductivity of the second switch, wherein the leakage current flows through the leakage path during a positive half cycle of the voltage applied across the first terminal and the second terminal.

In an example, the waveform generator comprises a voltage-controlled oscillator.

In an example, the waveform generator output signal is a periodic waveform having a frequency, wherein the waveform generator is configured to vary the frequency of the periodic output signal.

In an example, the waveform generator is configured to vary a magnitude of the periodic output signal.

In an example, the waveform generator output signal is a non-sinusoidal output signal.

In an example, the waveform generator output is aperiodic.

In an example, the voltage applied across the first and second terminal is a full-wave rectified mains voltage.

In an example, the first terminal is in electrical communication with a load hot terminal of the frequency-dependent ground fault interrupt wiring device, wherein the second terminal is in electrical communication with a earth ground terminal of the frequency-dependent ground fault interrupt wiring device.

In an example, the tester circuit is disposed within a housing, wherein the tester includes a plurality of plug blades dimensioned and arranged to engage with a receptacle of the frequency-dependent ground fault interrupt wiring device, wherein the first terminal is in electrical communication with the load hot terminal via a plug blade of the plurality of plug blades engaged with a load hot receptacle of the frequency-dependent ground fault interrupt wiring device, wherein the second terminal is in electrical communication with the earth ground terminal via a plug blade of the plurality of plug blades engaged with an earth ground receptacle of the frequency-dependent ground fault interrupt wiring device.

In an example, the first terminal is in electrical communication with a load hot terminal of the frequency-dependent ground fault interrupt wiring device, wherein the second terminal is in electrical communication with a line neutral terminal of the frequency-dependent ground fault interrupt wiring device.

In an example, the first terminal is in electrical communication with a line hot terminal of the frequency-dependent ground fault interrupt wiring device, wherein the second terminal is in electrical communication with a load neutral terminal of the frequency-dependent ground fault interrupt wiring device.

BRIEF DESCRIPTION OF THE DRAWINGS

The present invention will be more fully understood and appreciated by reading the following Detailed Description in conjunction with the accompanying drawings. The accompanying drawings illustrate only typical embodiments of the disclosed subject matter and are therefore not to be considered limiting of its scope, for the disclosed subject matter may admit to other equally effective embodiments. Reference is now made briefly to the accompanying drawings, in which.

DETAILED DESCRIPTION

Various examples described herein are directed to a test circuit and device that modulates a leakage current to test the trip threshold of a GFCI wiring device at frequencies other than the fundamental frequency of a mains voltage. Alternatively, or additionally, the test circuit and device can modulate the leakage current using any non-sinusoidal waveform, including aperiodic waveforms. Such non-sinusoidal waveforms can be used to test the response of the wiring device to, for example, nuisance loads or to arc faults.

Figure 1:
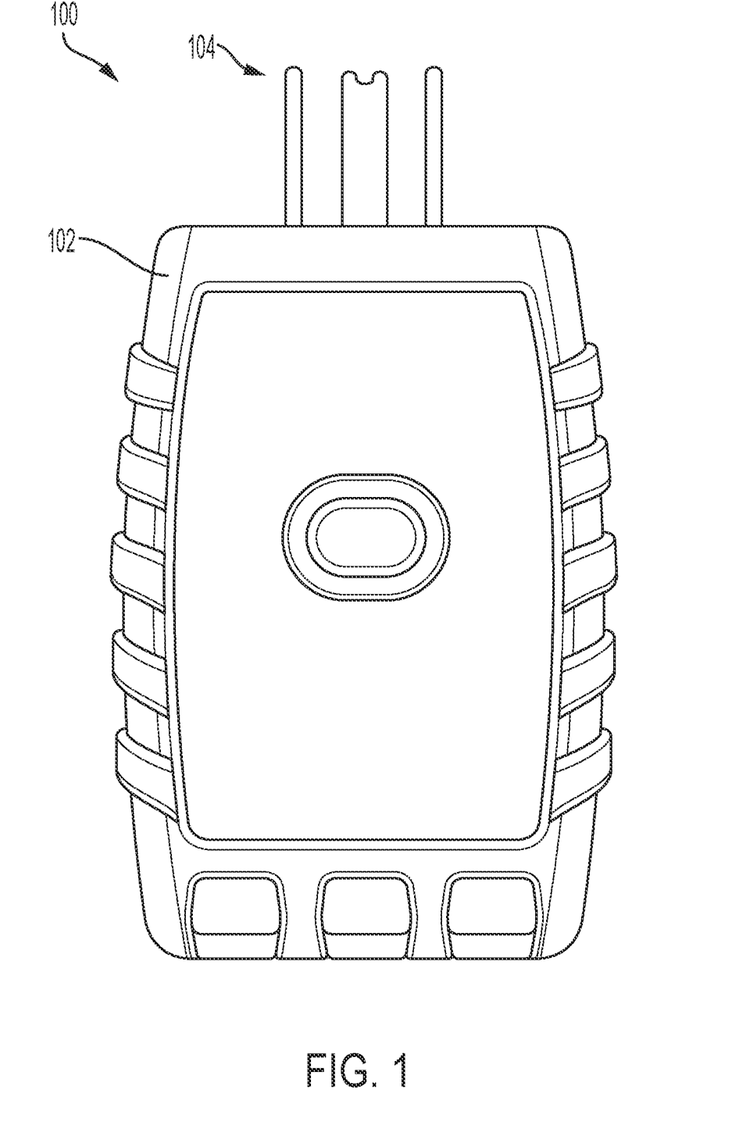
FIG. 1 depicts a tester for testing a frequency-dependent ground fault interrupt wiring device, according to an example.

FIG. 1 depicts a ground fault circuit interrupter receptacle tester 100 to test a frequency-dependent ground fault interrupt (GFCI) wiring device. As shown the tester 100 includes a housing 102 that houses a tester circuit (an example of which is tester circuit 200, which is described in detail in FIG. 2). A set of plug blades 104 extend from housing 102 and are dimensioned and arranged to insert into the receptacle of a frequency dependent GFCI wiring device. At a high level, tester 100, when plugged into a GFCI wiring device, leaks current from load hot to earth ground. Stated differently, current that flows through the hot conductor to the load hot terminal returns through earth ground rather than through the neutral conductor. The GFCI wiring device, which monitors the difference between the current in the hot conductor and the neutral conductor, detects that current present in the hot conductor is not similarly present in the neutral conductor. If the difference is greater than the trip threshold in excess of a predetermined duration (e.g., 5 ms), and the GFCI wiring device is operational, the GFCI wiring will trip. It should be understood that the exact form of the housing 102 and plug blades 104 of tester 100 can vary, as long as the tester 100 houses a circuit that engages with the GFCI wiring device and operates to test the trip threshold of the GFCI wiring device by modulating a leakage current at frequencies greater than the fundamental frequency of a mains voltage.

For the purposes of this disclosure, a leakage current is any current that flows through the GFCI hot conductor to a load and does not return through the GFCI neutral conductor or that flows through the GFCI neutral conductor to a load and does not return through the GFCI hot conductor, such that the toroid of the GFCI wiring device detects a current differential between the hot conductor and the neutral conductor. Here, the load need not necessarily be an attached device, but rather should be understood to be the ultimate destination of the current.

Figure 2:
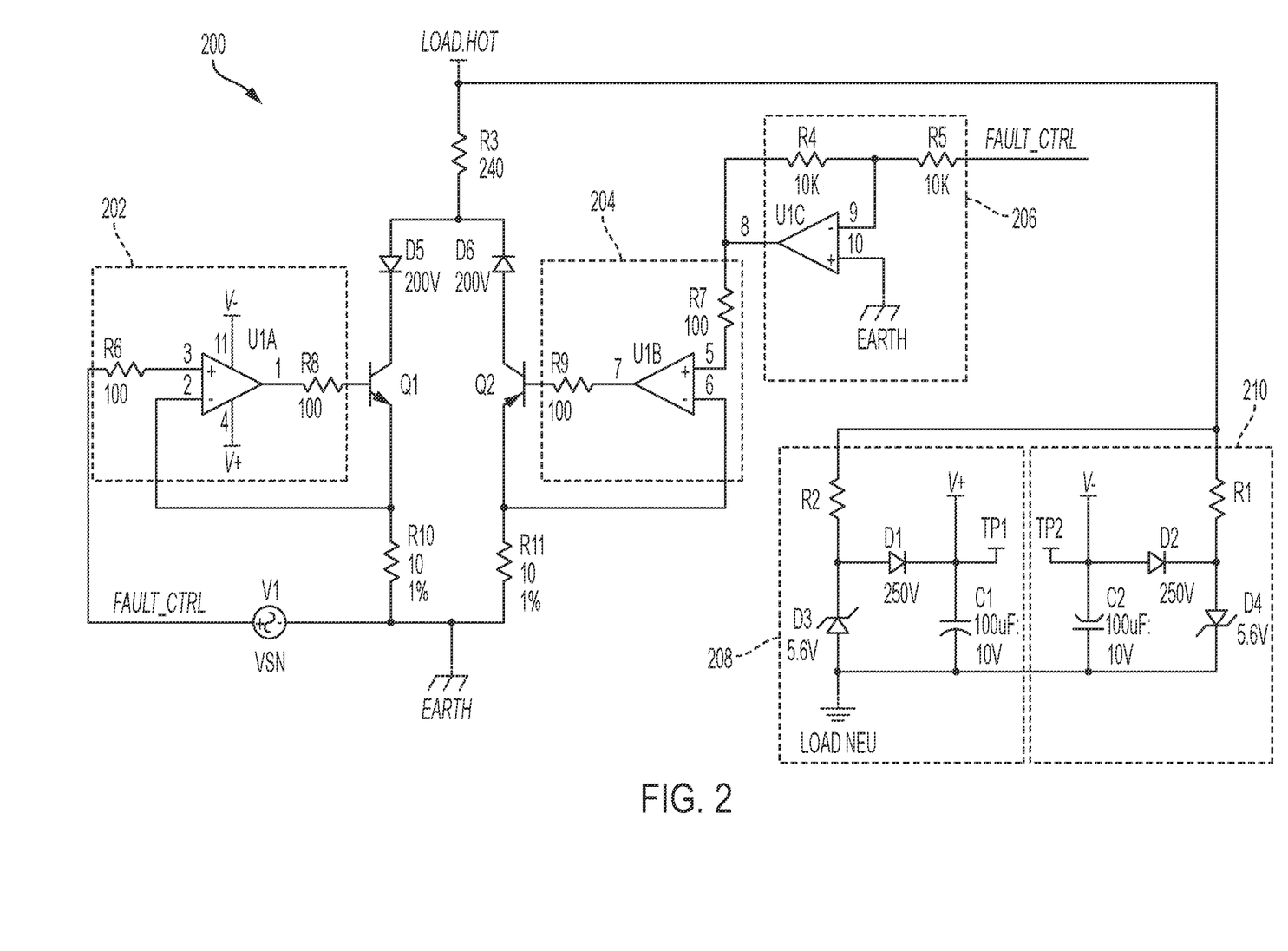
FIG. 2 depicts a schematic of a tester circuit for testing a frequency-dependent ground fault interrupt wiring device, according to an example.

FIG. 2 depicts a circuit schematic of an example tester circuit 200 to be included in tester 100 and that modulates a leakage current according to a waveform generator V1, which, in some examples, can produce frequencies greater than the fundamental frequency of a mains voltage. As shown, in this example, tester circuit 200 comprises a waveform generator V1, and at least one switch Q1, Q2, which modulates the current flowing through at least one leakage path according to output of waveform generator V1. More particularly, in this example, the main active leakage path is provided in two paths: (1) a positive path starting at load hot and passing through R3, D5, Q1 and R10 to finish at earth ground and (2) a negative path starting at earth ground and passing through R11, Q2, D6 and R3 to finish at load hot. Generally speaking, because of the polarity of diodes D5 and D6, the modulated current will flow through the positive path, between load hot and earth ground terminals, when the line voltage is positive and through the negative path, between the earth ground and load hot terminals, when the line voltage is negative.

Typically, during operation, the load hot, load neutral, and earth ground terminals of tester circuit 200 are respectively connected to the load hot, load neutral, and earth ground terminals of the GFCI wiring device receptacle via plug blades 104 that are inserted into the GFCI receptacle face plate. In alternative examples, however, the GFCI wiring device's response to a forward polarity fault can tested by connecting the load hot terminal of tester circuit 200 to the GFCI load hot terminal and earth ground terminal of tester circuit 200 to the GFCI line neutral terminal. Likewise, the response to a reverse polarity fault can be tested by connecting the load hot terminal of tester circuit 200 to the GFCI line hot terminal and the earth ground terminal of tester circuit 200 to the GFCI load neutral terminal.

It should be understood that, to the extent that terminals of the tester circuit 200 are connected to GFCI line hot or GFCI line neutral, this connection cannot be created by inserting plug blades into the receptacle face of the GFCI wiring device. Instead, this connection can be created by connection to terminals that typically are exposed on the side of the GFCI wiring device and which are generally disposed within a wall box after installation. Thus, in this example, the forward polarity ground fault testing or reverse polarity ground fault testing is typically accomplished before installation. For example, the forward or reverse polarity ground fault testing can include testing by the manufacturer or a third party before the GFCI wiring device is sold (e.g., during manufacture) or by a technician or other user after the device is sold but before installation is complete (as access to the terminals located on the side of the device is available before installation is finished).

Turning first to operation of the positive path, during the positive half-cycle diode D5 is forward biased, permitting the leakage current to flow from the load hot terminal to the earth ground terminal. The magnitude of the leakage current is adjusted by the amount of current permitted by switch Q1. That is, if Q1 is active, a maximum amount of leakage current is allowed to flow through the positive path to earth ground; whereas, if Q1 is in cutoff, a minimum amount of leakage current is allowed to flow. Thus, by varying the voltage at the base (or gate, where Q1 is a FET) of Q1, the amount of leakage current can be modulated.

When Q1 is active, R3 is the primary max leakage current limiting component and R10 is secondary. The primary purpose for R10 is as a current sense resistor, its output being compared to the output of waveform generator V1 by the comparator 202 formed by op amp U1A and its associated components, resistors R6 and R8. (V1 can be implemented as a voltage-controlled oscillator (VCO) or, in alternative examples, as a benchtop waveform generator, or as any suitable circuit for generating a desired waveform.) As will be described in more detail below, the output of comparator 202, which is input to switch Q1, varies to maintain the voltage across resistor R10 equal to the output of waveform generator V1. Thus, the input to Q1 is varied in a manner to modulate the leakage current so that it follows the waveform of waveform generator V1, that is, the frequency of the leakage current is substantially equal (i.e., within ±10 Hz) to the frequency of the output signal of the waveform generator V1. The frequency of the leakage current can therefore be set or adjusted according to the frequency of waveform generator V1.

More specifically, as positive leakage current passes through resistor R10, the resulting voltage is measured by U1A on the inverting input. This leakage current sense voltage is compared to the signal generated by waveform generator V1. If leakage current sense voltage at resistor R10 is less than the output voltage of V1, then the voltage of the U1A output will increase. This can be seen at time t1 of FIG. 3: The V1 output voltage is increasing, thus the R10 leakage current sense voltage is smaller at time t1 than the V1 output voltage, and the output of U1A is increasing. This increase will continue until leakage current sense voltage is equal to the output voltage of waveform generator V1, which occurs when the waveform generator output peaks and begins decreasing. At time t2, the waveform generator V1 output signal is decreasing, and thus the current leakage sense voltage at R10 is greater than the V1 output signal, resulting in a decreasing output of U1A. This decrease will continue until the leakage current sense voltage is equal to the output voltage of V1, when the V1 output voltage reaches its nadir and begins increasing. The operation of U1A thus serves to adjust the conductivity of BJT Q1 between a saturation mode and a cutoff mode—i.e., typically in the linear mode—according to the respective values of V1 and the line voltage, in order to modulate the leakage current flowing between HOT and NEU during the positive half-cycle. In this way, the output of comparator 202 varies the input to switch Q1 such that the current through R10 follows the voltage waveform of waveform generator V1, consequently modulating the leakage current in a manner that follows the voltage waveform of waveform generator V1. For the purposes of this disclosure, "following" or "follows" means that the leakage current reproduces the shape of the waveform generator output signal as a proportional waveform.

The negative path, which again comprises R11, Q2, D6 and R3, operates during the negative half cycle in the same manner as positive path during the positive half cycle. That is, comparator 204 adjusts switch Q2 to modulate the leakage current flowing from the earth ground terminal to the load hot terminal, such that the current through R11 follows the inverted voltage of waveform generator V1. A secondary path is used in this example because, even though the output of comparator 202 would be negative during the negative half cycle, switch Q1, which here is an NPN BJT, would enter cutoff, thus blocking the flow of leakage current from the earth ground terminal to the load hot terminal. Accordingly, the negative path employs a PNP BJT, which enters the active mode in response to a negative input voltage from comparator 204. Note that besides polarity differences, inverter 206 is included, which comprises op amp U1C and its associated components, resistors R4 and R5, to invert the V1 output signal in order to make it compatible with comparator 204.

Figure 3:
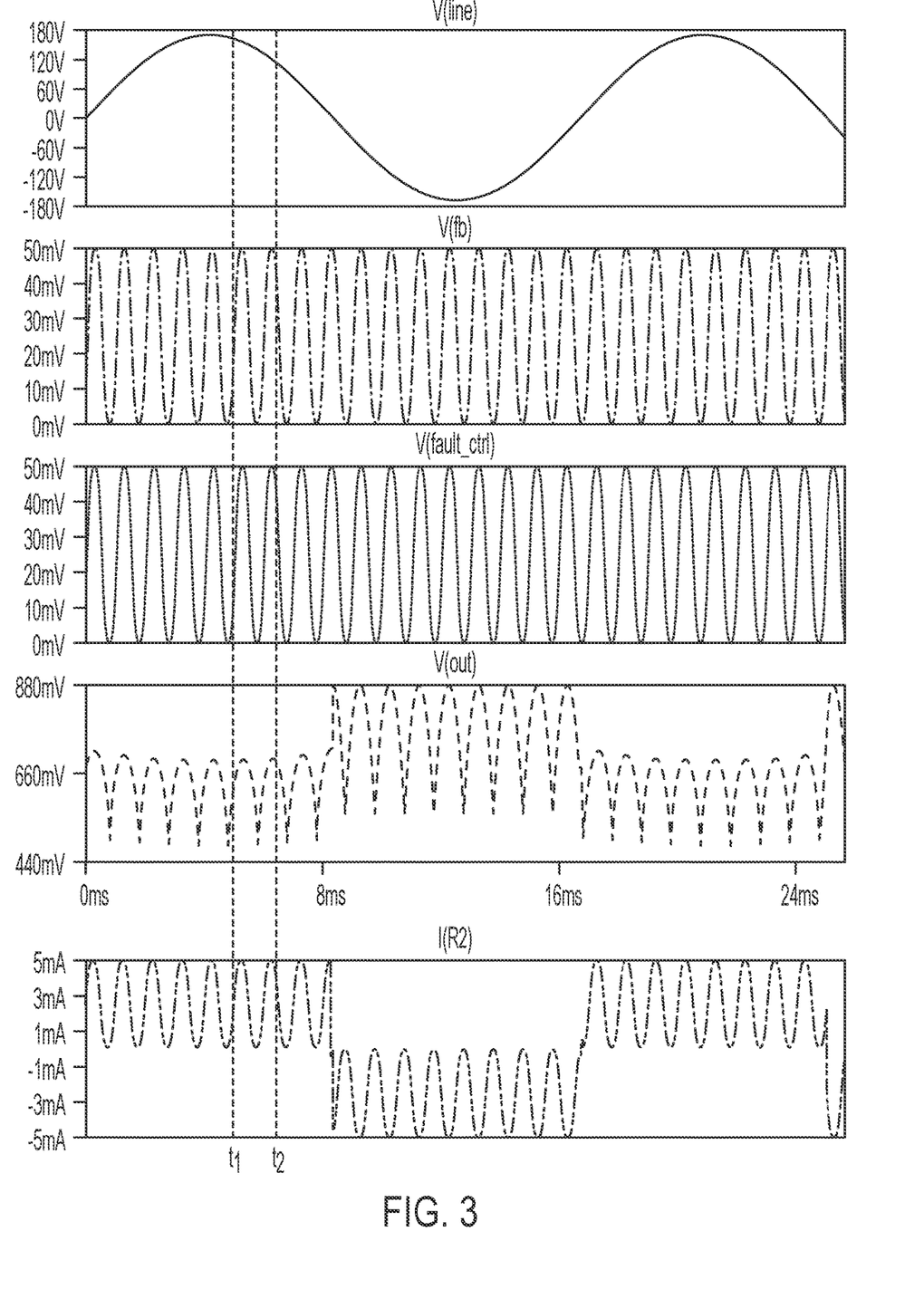
FIG. 3 depicts a timing diagram for a tester circuit for a frequency-dependent ground fault interrupt wiring device, according to an example.

Accordingly, during the positive half-cycle of line voltage, the positive path is employed to modulate the leakage current; whereas, during the negative half-cycle, the negative path is employed to modulate the leakage current. As shown in FIG. 3, the net current through R3 is modulated to form a sinusoidal waveform with a positive offset (i.e., the waveform will oscillate, according to waveform generator V1, from 0 to some positive value) during the positive half cycle and modulated to form a sinusoidal waveform with a negative offset (i.e., the waveform will oscillate, according to waveform generator V1, from 0 to some negative value).

The leakage current (IF) amplitude can selected by selecting V1's amplitude such that $I_F = V_{v1}/R_{10}$ for the positive half cycle and $I_F = V_{v1}/R_{11}$ for the negative half cycle. As described above, the frequency of the leakage current can similarly be selected by selecting the frequency of the waveform generator V1. In this way, waveform generator V1 will actively control the attributes leakage current, including frequency, amplitude and shape (sinusoidal, sawtooth, square wave, aperiodic waveforms, etc.).

Waveform generator V1 can be configured to automatically sweep from a minimum frequency to a maximum frequency, in order to test the GFCI wiring device at a variety of frequencies, including frequencies above the fundamental frequency of the mains voltage. Alternatively, the frequency or other characteristics of waveform generator V1 can be selected by a user according to a user interface, such as buttons or a touch screen disposed on the housing 102 exterior.

As used in this disclosure, a waveform generator can produce any desired arbitrary waveform, including, e.g., non-sinusoidal and aperiodic waveforms. For example, the waveform generator V1 can be configured to generate a non-sinusoidal waveform to simulate a nuisance load (such a vacuum cleaner) or an arc fault. The arc fault can, for example, be simulated by creating a waveform that adds current spikes and/or "shoulders" to a sine wave. A person of ordinary skill in the art will readily understand, in conjunction with a review of this disclosure, that various waveforms can be generated to simulate a variety of nuisance loads or arc faults.

In certain examples, during testing, the magnitude of the leakage current can be set at a value slightly lower than the trip threshold for one or more frequencies above the mains frequency, to ensure that the GFCI wiring device is not tripping for leakage current values that are lower than the minimum required by the standard. These same frequencies, or different frequencies, can be testing for leakage current values that are above the trip threshold, to ensure that the GFCI wiring is tripping for the correct values. Because the magnitude and frequency of the leakage current are selectable according magnitude and frequency of waveform generator V1, a user can select a desired frequency and leakage current to use for a particular test. This can be accomplished through a user interface such as a connected computer or mobile device, or through buttons or a touchscreen disposed on the tester itself. In certain examples, a user can preload a certain test routine into memory that tests a GFCI wiring device at a desired number of frequencies and leakage current values. The test routine can be selected through the press of a button or can run automatically and repeatedly, starting when the tester is is first powered.

As used in this disclosure, a comparator is any circuit suitable for producing an output based on a comparison between the waveform generator V1 output and a value representative of the leakage current. Because the output of the comparator is input to a switch (e.g., switch Q1, Q2) that varies the magnitude of the current flowing through the leakage path, the value representative of the leakage current operates as a feedback signal to the comparator. Stated differently, the comparator functions, together with switch Q1, Q2, to adjust the magnitude of the current through the leakage path, which is then input to the comparator 202 as a value to be compared against the waveform generator V1 output. This functions to generally retain the switch Q1, Q2 in the linear region to suitably modulate the leakage current according to the output of V1. A comparator, then, as used in this disclosure should not be limited to that class of op amp topologies which do not feature a feedback signal or which only output a signal at the positive or negative rails of the op amp according to the comparison of the input signals. Indeed, in various alternative examples, the comparator can take the form of an op amp topology of an inverting or non-inverting amplifier or a differential amplifier.

The comparators 202 and 204 are powered by power supply circuits 208 and 210, which are functionally low-pass filters that generate positive DC voltage V+ and negative DC voltage V−. The operation of power supply circuits 208 and 210 will be generally understood and thus will not be described here. Furthermore, the power supply circuits 208 and 210 are only provided as examples of power supply circuits that can be used to generate the DC voltage inputs to comparators 202 and 204, and any suitable power supply circuit can be used.

As shown in FIG. 3, the modulated leakage current does not follow a true sine wave, but rather is offset according to each half cycle. This is due to the way that leakage current modulates the line voltage, resulting in an exclusively positive waveform when the line voltage is positive and an exclusively negative waveform when the line voltage is negative. This can be resolved by fully rectifying the mains voltage applied between the load hot terminal and the earth ground terminal of the tester. In this example, rather than alternating between positive and negative current, depending on the half cycle of the mains voltage, the current stays either positive or negative (depending on how the rectification is accomplished), irrespective of half cycle. Such an example obviates the need for one of the leakage paths, as two leakage paths are provided in FIG. 2 to address both half cycles. Thus, if the full-wave rectifier applies an exclusively positive voltage across the load hot and earth ground terminals, only a positive leakage path (e.g., a leakage path including components R3, Q1, and R10) and only one comparator (e.g., comparator 202) need be included, as the there is no negative current for the negative leakage path to act upon. Alternatively, if the full-wave rectifier applies an exclusively negative voltage across the load hot and earth ground terminals, only a negative leakage path (e.g., a leakage path including components R3, Q2, and R11) and one comparator (e.g., comparator 204) need to be included, as there is no positive current for the positive leakage path to act upon.

While several inventive embodiments have been described and illustrated herein with reference to certain exemplary embodiments, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein (and it will be understood by one skilled in the art that various changes in detail may be effected therein without departing from the spirit and scope of the invention as defined by claims that can be supported by the written description and drawings). More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto; inventive embodiments may be practiced otherwise than as specifically described and claimed. Further, where exemplary embodiments are described with reference to a certain number of elements it will be understood that the exemplary embodiments can be practiced utilizing either less than or more than the certain number of elements.

All references, including publications, patent applications, and patents, cited herein are hereby incorporated by reference to the same extent as if each reference were individually and specifically indicated to be incorporated by reference and were set forth in its entirety herein.

All definitions, as defined and used herein, should be understood to control over dictionary definitions, definitions in documents incorporated by reference, and/or ordinary meanings of the defined terms.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if not directly attached to where there is something intervening.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

The invention claimed is:

1. A tester for a frequency-dependent ground fault interrupt wiring device, comprising:
   a tester circuit, comprising:
   a switch disposed between a first terminal and a second terminal, wherein a leakage current flows through a leakage path between the first terminal and the second terminal when a voltage is applied across the first terminal and the second terminal, a magnitude of the leakage current being determined, at least in part, by a conductivity of the switch;
   a waveform generator configured to generate a waveform generator output signal; and
   a comparator configured to generate a comparator output signal based on a comparison of the waveform generator output signal to a current sense signal, the current sense signal being representative of the leakage current, wherein the conductivity of the switch is adjusted according to the comparator output signal such that the leakage current follows the waveform generator output signal.

2. The tester of claim 1, wherein the waveform generator output signal is a periodic waveform having a frequency, wherein the frequency waveform generator output signal is greater than a frequency of the voltage applied across the first terminal and the second terminal.

3. The tester of claim 2, wherein the voltage applied across the first terminal and the second terminal is a mains voltage.

4. The tester of claim 1, further comprising a second switch disposed between the first terminal and the second terminal, wherein during a negative half cycle of the voltage applied across the first terminal and the second terminal, a second leakage current flows through a second leakage path, the magnitude of the second leakage current being determined, at least in part, by the conductivity of the second switch, wherein the leakage current flows through the leakage path during a positive half cycle of the voltage applied across the first terminal and the second terminal.

5. The tester of claim 4, further comprising a second comparator configured to a second comparator output signal based on a comparison of an inverted periodic output signal, the inverted periodic output signal being an inverse of the periodic output signal, to a second current signal, the second current sense signal being representative of the second leakage current, wherein the conductivity of the second switch is adjusted according to the second comparator output signal such that the frequency of the second leakage current is substantially equal to a frequency of the waveform generator.

6. The tester of claim 1, wherein the waveform generator comprises a voltage-controlled oscillator.

7. The tester of claim 1, wherein the waveform generator output signal is a periodic waveform having a frequency, wherein the waveform generator is configured to vary the frequency of the periodic output signal.

8. The tester of claim 1, wherein the waveform generator is configured to vary a magnitude of the waveform generator output signal.

9. The tester of claim 1, wherein the waveform generator output signal is a non-sinusoidal output signal.

10. The tester of claim 9, wherein the waveform generator output is aperiodic.

11. The tester of claim 1, wherein the voltage applied across the first and second terminal is a full-wave rectified mains voltage.

12. The tester of claim 1, wherein the first terminal is in electrical communication with a load hot terminal of the frequency-dependent ground fault interrupt wiring device, wherein the second terminal is in electrical communication with an earth ground terminal of the frequency-dependent ground fault interrupt wiring device.

13. The tester of claim 12, wherein the tester circuit is disposed within a housing, wherein housing the includes a plurality of plug blades dimensioned and arranged to engage with a receptacle of the frequency-dependent ground fault interrupt wiring device, wherein the first terminal is in electrical communication with the load hot terminal via a plug blade of the plurality of plug blades engaged with a load hot receptacle of the frequency-dependent ground fault interrupt wiring device, wherein the second terminal is in electrical communication with the earth ground terminal via a plug blade of the plurality of plug blades engaged with an earth ground receptacle of the frequency-dependent ground fault interrupt wiring device.

14. The tester of claim 1, wherein the first terminal is in electrical communication with a load hot terminal of the frequency-dependent ground fault interrupt wiring device, wherein the second terminal is in electrical communication with a line neutral terminal of the frequency-dependent ground fault interrupt wiring device.

15. The tester of claim 1, wherein the first terminal is in electrical communication with a line hot terminal of the frequency-dependent ground fault interrupt wiring device, wherein the second terminal is in electrical communication with a load neutral terminal of the frequency-dependent ground fault interrupt wiring device.

16. A tester for a frequency-dependent ground fault interrupt wiring device, comprising:
   a tester circuit, comprising:
   a switch disposed between a first terminal and a second terminal, wherein a leakage current flows through a leakage path between the first terminal and the second terminal when a voltage is applied across the first terminal and the second terminal, a magnitude of the leakage current being determined, at least in part, by a conductivity of the switch; and
   a waveform generator configured to generate a waveform generator output signal, wherein the switch is driven to modulate the magnitude of the leakage current such that the leakage current follows the waveform generator output signal.

17. The tester of claim 16, wherein the waveform generator output signal is a periodic waveform having a frequency, wherein the frequency waveform generator output signal is greater than a frequency of the voltage applied across the first terminal and the second terminal.

18. The tester of claim 17, wherein the voltage applied across the first terminal and the second terminal is a mains voltage.

19. The tester of claim 16, further comprising a second switch disposed between the first terminal and the second terminal, wherein during a negative half cycle of the voltage applied across the first terminal and the second terminal, a second leakage current flows through a second leakage path, the magnitude of the second leakage current being determined, at least in part, by the conductivity of the second switch, wherein the leakage current flows through the leakage path during a positive half cycle of the voltage applied across the first terminal and the second terminal.

20. The tester of claim 16, wherein the waveform generator comprises a voltage-controlled oscillator.

21. The tester of claim 16, wherein the waveform generator output signal is a periodic waveform having a frequency, wherein the waveform generator is configured to vary the frequency of the periodic output signal.

22. The tester of claim 16, wherein the waveform generator is configured to vary a magnitude of the periodic output signal.

23. The tester of claim 16, wherein the waveform generator output signal is a non-sinusoidal output signal.

24. The tester of claim 23, wherein the waveform generator output is aperiodic.

25. The tester of claim 16, wherein the voltage applied across the first and second terminal is a full-wave rectified mains voltage.

26. The tester of claim 16, wherein the first terminal is in electrical communication with a load hot terminal of the frequency-dependent ground fault interrupt wiring device, wherein the second terminal is in electrical communication with a earth ground terminal of the frequency-dependent ground fault interrupt wiring device.

27. The tester of claim 26, wherein the tester circuit is disposed within a housing, wherein the tester includes a plurality of plug blades dimensioned and arranged to engage with a receptacle of the frequency-dependent ground fault interrupt wiring device, wherein the first terminal is in electrical communication with the load hot terminal via a plug blade of the plurality of plug blades engaged with a load hot receptacle of the frequency-dependent ground fault interrupt wiring device, wherein the second terminal is in electrical communication with the earth ground terminal via a plug blade of the plurality of plug blades engaged with an earth ground receptacle of the frequency-dependent ground fault interrupt wiring device.

28. The tester of claim 16, wherein the first terminal is in electrical communication with a load hot terminal of the frequency-dependent ground fault interrupt wiring device, wherein the second terminal is in electrical communication with a line neutral terminal of the frequency-dependent ground fault interrupt wiring device.

29. The tester of claim 16, wherein the first terminal is in electrical communication with a line hot terminal of the frequency-dependent ground fault interrupt wiring device, wherein the second terminal is in electrical communication with a load neutral terminal of the frequency-dependent ground fault interrupt wiring device.

* * * * *